(12) United States Patent
Riexinger et al.

(10) Patent No.: US 9,455,710 B2
(45) Date of Patent: Sep. 27, 2016

(54) CLOCK ENABLING CIRCUIT

(71) Applicant: Dialog Semiconductor GmbH, Kirchheim/Teck-Nabern (DE)

(72) Inventors: Joachim Riexinger, Gammelshausen (DE); Armin Fischer, Roemerstein (DE)

(73) Assignee: Dialog Semiconductor (UK) Limited, London (GB)

( * ) Notice: Subject to any disclaimer, the term of this patent is extended or adjusted under 35 U.S.C. 154(b) by 92 days.

(21) Appl. No.: 14/491,001

(22) Filed: Sep. 19, 2014

(65) Prior Publication Data

US 2015/0288363 A1    Oct. 8, 2015

(30) Foreign Application Priority Data

Apr. 3, 2014   (EP) .................................... 14163462

(51) Int. Cl.
| | |
|---|---|
| *H03K 3/037* | (2006.01) |
| *H03K 19/00* | (2006.01) |
| *G06F 1/04* | (2006.01) |
| *H03K 19/20* | (2006.01) |
| *G06F 1/32* | (2006.01) |

(52) U.S. Cl.
CPC ............. *H03K 19/0016* (2013.01); *G06F 1/04* (2013.01); *H03K 19/20* (2013.01); *G06F 1/3237* (2013.01)

(58) Field of Classification Search
CPC ....................................................... H03K 3/037
See application file for complete search history.

(56) References Cited

U.S. PATENT DOCUMENTS

| | | |
|---|---|---|
| 5,808,486 A | 9/1998 | Smiley |
| 6,353,341 B1 | 3/2002 | Lesea et al. |
| 8,659,336 B2 * | 2/2014 | Kulmala ................... H03L 7/00 327/142 |
| 2007/0024318 A1 | 2/2007 | Mamidipaka |

OTHER PUBLICATIONS

European Search Report 14163462.6-1810 Mailed: Oct. 1, 2014, Dialog Semiconductor GmbH.

* cited by examiner

*Primary Examiner* — Hai L Nguyen
(74) *Attorney, Agent, or Firm* — Saile Ackerman LLC; Stephen B. Ackerman (57) ABSTRACT

A clock enabling circuit for providing a gated clock signal in response to receiving clock request information is presented. The clock enabling circuit comprises a clock request input, a clock input, and a flip-flop stage. It also includes a first sub-circuitry comprising a first input being coupled with the clock request input and an output being coupled with the flip-flop stage for providing a set information to the flip-flop stage in response to the receipt of the clock request information, the flip-flop stage being configured to provide a clock enabling information in response to receiving the set information and a second sub-circuitry comprising a first and a second input, the first input being coupled with the clock input and the second input being coupled with the flip-flop stage, the second sub-circuitry comprising an output for providing the gated clock signal in response to receiving the clock enabling information.

27 Claims, 3 Drawing Sheets

CLOCK ENABLING CIRCUIT

TECHNICAL FIELD

The present document relates to clock enabling circuits. In particular, the present document relates to power-efficient clock enabling circuits providing a glitch-free gated clock signal even if a clock request signal is received asynchronously with a clock signal.

BACKGROUND

Digital circuits used in electrical devices often have a modular design. Said modular digital circuits may comprise multiple circuit blocks, wherein each of these blocks is designed to carry out predetermined processes within the electrical device. Power consumption plays an increasingly important role in electrical devices, in particular for portable or mobile devices. In order to minimize the power consumption of the digital circuits, circuit blocks may be disabled or put into stand-by-mode when the processes carried out by said circuit blocks are not required at the moment. During stand-by-mode, the clock signal provided to the not-required circuit blocks may be switched off. Thereby electrical power consumption of the modular digital circuit is minimized. For providing a gated clock signal, a digital circuit may comprise a clock enabling circuit. The clock enabling circuit may be adapted to enable, respectively, disable the gated clock signal. Thereby, the gated clock signal provided to a circuit block can be switched on/off.

SUMMARY

It is an object of the present invention to provide for a clock enabling circuit with minimized electrical power consumption. According to an aspect, a clock enabling circuit for providing a gated clock signal is disclosed. The gated clock signal may be enabled or switched on in response to receiving a clock request information, e.g. a clock request signal. The clock enabling circuit may comprise a clock request input for receiving clock request information, a clock input for receiving a clock signal and a flip-flop stage. The flip-flop stage may be a synchronizing stage for synchronizing the gated clock signal with the clock signal. The flip-flop stage may include at least a first and a second flip-flop. Said flip-flops may be for example D-flip-flops wherein an output of the first flip-flop is coupled with the input of a second flip-flop. The gated clock signal is switched on and off synchronous with the clock signal only at times when the clock signal changes. In other words, the cycles of the gated clock signal are not cut off and correspond to full cycles of the clock signal even though the clock request information may be received asynchronously with the clock signal.

The clock enabling circuit may further comprise a first sub-circuitry. Said first sub-circuitry includes at least a first input being coupled with the clock request input and an output being coupled with the output of the flip-flop stage for providing a set information (e.g. a set signal) to the flip-flop stage in response to receiving the clock request information. More specifically, the output of the first sub-circuitry may be coupled with set inputs of flip-flops included in the flip-flop stage. The flip-flop stage is configured to provide a clock enabling information at its output (e.g. a clock enabling signal) in response to receiving the set information. Said clock enabling information may be provided immediately (without taking gate latencies into account) after the clock request information is received while the related clock signal is asserted.

In addition, the clock enabling circuit may further comprise a second sub-circuitry comprising a first and a second input. The first input is coupled with the clock input and the second input is coupled with the output of the flip-flop stage in order to receive the clock enabling information. The second sub-circuitry further comprises an output for providing the gated clock signal in response to receiving the clock enabling information and based on the clock signal. Furthermore, the clock inputs of the first and second flip-flop may be coupled with the output of the second sub-circuitry in order to be triggered by the gated clock signal. By using the gated clock signal for the first and second flip-flop, the power consumption of the clock enabling circuit is reduced because in the switched-off state of the gated clock signal, the flip-flop-stage is disabled and a periodical charging and discharging of capacities of the flip-flops can be avoided.

According to embodiments, the first sub-circuitry may comprise an output being coupled with the set-inputs of the first and second flip-flop. So, the set information directly influences the switching state of the flip-flops. The clock enabling information is therefore immediately provided at the output of the flip-flop stage after receiving the set information at the set-inputs of the first and second flip-flop. Thereby the enable time of the gated clock signal, i.e. the time period between receiving the clock request information and providing the gated clock signal at the output of the clock enabling circuit is minimized.

According to embodiments, the first sub-circuitry may be further coupled with the clock input and comprises a first sub-circuitry portion configured to provide the set information to the flip-flop stage triggered by the clock signal and the clock request information. For example, the set information may be generated upon receipt of the clock request information and when (as soon as) the clock input is high. The first sub-circuitry portion may be adapted to provide the set information after, specifically shortly after the receipt of the clock request information. In other words, for providing the set information to the flip-flop stage, the first sub-circuitry portion causes a change of the signal level (e.g. from logical low to logical high) at the set input of the first and second flip-flop. In yet another words, the first sub-circuitry portion initiates the provision of the gated clock signal by providing the set information to the flip-flop stage after the clock request information has been received and during a time when the next clock pulse is high.

According to embodiments, the first sub-circuitry may comprise a second sub-circuitry portion configured to uphold or maintain the set information based on the clock request information. The second sub-circuitry portion may be adapted to provide/hold the set information to the flip-flop stage as long as the clock request information is received. In other words, the second sub-circuitry portion may be configured to maintain the set information, which has been generated by the first sub-circuitry portion, as long as the clock request is active (e.g. the clock request signal is high). The second sub-circuitry portion may receive the clock request information and the clock enabling information provided at the output of the flip-flop stage, and generates the set information based upon the logical state associated with these informations/signals. Thereby, the flip-flops of the flip-flop stage are set or kept in the set state as long as the clock request information is received.

According to embodiments, the first sub-circuitry may comprise a first and a second AND-gate and an OR-gate, wherein each output of the AND-gates is coupled with an input of the OR-Gate and the output of the OR-gate constitutes or forms the output of the first sub-circuitry. By using a simple gate structure with only two AND-gates and one OR-gate, the time delay between receiving the clock request information and generating the set information at the output of the first sub-circuitry is minimized.

In fact there are several possibilities to implement such a first sub-circuitry, e.g. using an OR-gate combined with an AND-gate, with equal functionality. For example, the inputs of the OR-gate may be coupled with the clock input and the clock enabling information, respectively. Further, the inputs of the AND-gate may be coupled with the clock request input and the output of the OR-gate, respectively. In this implementation, the output of the AND-gate is the output of the first sub-circuitry.

According to embodiments, a first input of the first AND-gate may be coupled with the clock request input and the second input of the first AND-gate is coupled with the output of the flip-flop stage in order to receive the clock enabling information. Said first AND-gate may form a hold-gate for maintaining the set information as long as the clock request information is received, thereby forming the second sub-circuitry portion.

According to embodiments, a first input of the second AND-gate may be coupled with the clock request input and the second input of the second AND-gate is coupled with the clock input. Said second AND-gate may provide a digital 'one' (e.g. a high level signal) at its output when the digital levels of the clock request information and the clock signal are high, thereby initiating the generation of the set information and forming the first sub-circuitry portion.

According to embodiments, the second sub-circuitry may comprise a triggering circuitry configured to provide a synchronized clock enabling information (e.g. a synchronized clock enabling signal) based on the clock enabling information. The synchronized clock enabling information may be synchronized with an edge or level of the clock signal. More specifically, the synchronized clock enabling signal may have a rising or falling edge which is time-synchronized with an edge or level of the clock signal. Said synchronized clock enabling signal may be further used for providing the gated clock signal in synchronization with the clock signal.

According to embodiments, the second sub-circuitry may comprise a gate circuitry, the gate circuitry being configured to receive the synchronized clock enabling information provided by the triggering circuitry. Furthermore, the gate circuitry may be configured to provide the gated clock signal based on the synchronized clock enabling information and the clock signal. By means of the gate circuitry, the gated clock signal is provided in synchronization with the clock signal. Specifically, the second sub-circuitry, i.e. the serial connection of the triggering circuitry and the gate circuitry, enables a synchronous activation of the gated clock signal at a rising edge of the clock signal and a synchronous deactivation of the gated clock signal at a falling edge of the clock signal.

According to further embodiments, the triggering circuitry may comprise a latch with an enabling input, the enabling input receiving the inverted clock signal. Furthermore, the first sub-circuitry portion of the first sub-circuitry may be configured to provide the set information to the flip-flop stage when the digital level of the clock signal is high. Thus, the latch of the triggering circuitry is enabled by a logical low level of the clock signal (or triggered by the falling edge of the clock signal), wherein the first sub-circuitry portion is enabled by a logical high level of the clock signal (or triggered by the rising edge of the clock signal). In other words, the rising edge of synchronized clock enabling information is valid at, or shortly after, a falling edge of the clock signal. Said inverse (phase shifted) enabling/triggering is advantageous because thereby a glitch-free gated clock signal is obtained. After generating the set information by the first sub-circuitry portion and, subsequently, generating the clock enabling information, the latch has enough time (about a half clock cycle) for providing the synchronized clock enabling information at its output, which forms the gating signal for providing the gated clock signal. Thereby, the rising edge of the synchronized clock enabling information and the rising edges of the clock signal at the inputs of the gate circuitry are temporally separated.

According to further embodiments, the latch of the triggering circuitry may comprise a data input that is coupled with the output of the flip-flop stage for receiving the clock enabling information. Based on the inverted clock signal received at the enabling input of the latch, the clock enabling information received at the data input is stored by the latch when the clock signal is low and provided as synchronized clock enabling information at the output of said latch. Due to latch latency, said synchronized clock enabling information is provided a short period of time after the falling edge of the clock signal. Further, the rising edge of the synchronized clock enabling information is be well before the next rising edge of the clock signal is received. Thereby, peaks or glitches can be avoided when switching-on the gated clock signal by means of the gate circuitry. In other words, the second sub-circuitry including the triggering circuitry and the gate circuitry is adapted to provide the gated clock signal with a time delay between a half clock cycle and a full and a half clock cycle after the occurrence of the clock enabling information in order to provide a glitch-free gated clock signal.

According to further embodiments, the gate circuitry comprises an AND-gate, the AND-gate comprising a first input for receiving the synchronized clock enabling information provided by the triggering circuitry, a second input being coupled with the clock input for receiving the clock signal and an output for providing the gated clock signal. Preferably, the gate circuitry includes only a single AND-gate providing said gating functionality. Thereby, a minimized latency between the edge of the clock signal and the edge of the gated clock signal is obtained.

According to further embodiments, the data input of the first flip-flop of the flip-flop stage is connected with ground. After the set information has been switched off, the first flip-flop and—in the following clock cycle—also the second flip-flop receive a digital low level signal at its data input which synchronously de-asserts the clock enabling information provided at the output of the second flip-flop.

According to a further aspect, a method for providing a gated clock signal in response to receiving a synchronous clock request information is disclosed. The clock request information may be provided not in synchrony with a clock signal (CLK) that forms the basis for the gated clock signal. Therefore the method comprises receiving an asynchronous clock request information (REQ) and generating a clock enabling information (CLK_EN) based on the clock request information and the clock signal. The clock enabling information is provided when the clock signal is high. In other words, the rising edge of the clock enabling information is generated at times when the clock signal is high.

In embodiments, the clock enabling information is generated by a flip-flop stage comprising one or more D-flip-flops. In this case, a set signal may be derived from the clock request information and the clock signal and provided to the flip-flop stage to asynchronously set the flip flop(s) and generate the clock enabling information. The clock enabling information may be maintained/uphold for some time after the clock request information lapsed and cancelled (e.g. set to logical 'zero') synchronous with the clock signal, e.g. upon a rising edge of the clock signal. If a flip-flop stage is employed to generate the clock enabling information, the cancellation of the clock enabling information may be delayed for one or more periods of the clock cycle. Also other implementations are possible which might have impact on the cancellation delay (e.g. using a positive edge/negative edge flip-flop stage) but not on the functionality.

The method may further comprise generating a synchronized clock enabling information (sCLK_EN) based on the clock enabling information (CLK_EN), the synchronized clock enabling information may be essentially synchronous with a falling edge of the clock signal. The synchronized clock enabling information may be enabled (having a rising edge) essentially with a falling edge of the clock signal. Due to some small circuit latencies, the rising edge of the synchronized clock enabling information may be shortly after the falling edge of the clock signal. Thus, the synchronized clock enabling information is generated at a different point in time than the rising edge of the clock signal, which may be used to produce a glitch free gated clock signal (CLK_G). The method may further comprise providing the synchronized clock enabling information (sCLK_EN) to an additional gate (e.g. an AND gate) in order to provide the gated clock signal (CLK_G) in synchrony with the clock signal (CLK).

As already mentioned, when the clock request information (REQ) is removed, the clock enabling information (CLK_EN) is maintained for a while and cancelled synchronous with the clock signal (e.g. at a rising edge thereof). The synchronized clock enabling information (sCLK_EN) may then be cancelled at a later defined point in time, e.g. upon the next falling edge of the clock signal. Since the gate receives the synchronized clock enabling information and the clock information at inputs thereof, it can disable the gated clock signal glitch free and synchronous with the clock signal.

Another method for providing a gated clock signal in response to receiving clock request information comprises:
  receiving the asynchronous clock request information;
  generating a set information based on the asynchronous clock request information and a clock signal;
  providing the set information to a flip-flop stage in order to generate a clock enabling information based on the set information; and
  providing the clock enabling information to a clock gate circuitry in order to provide a glitch free gated clock signal based on the clock enabling information and the clock signal.

The flip-flops of the flip-flop stage may be triggered based on the gated clock signal. Said method is advantageous because the gated clock signal is provided with a minimized latency between receiving the clock request information and providing the gated clock signal. Furthermore, said method is power efficient because the flip-flop stage is triggered by the gated clock signal, i.e. the flip-flop stage is switched off if the gated clock signal is disabled.

Gated clock signal according to the present invention is to be understood as a switched clock signal which can be switched on and switched off synchronous with the clock signal. When switched on, the gated clock signal may be a square wave signal periodically toggling between digital one and digital zero. Typically, the switched-on gated clock signal is synchronized with the clock signal (neglecting gate latencies). When switched off, the gated clock signal may have a fixed value, e.g. digital zero.

Information according to the present invention may be any digital information, for example defined by a logical state of a digital signal. For example, clock request information may be provided to the clock enabling circuit if the digital signal received at the clock request input is high (positive logic). In another embodiment, the clock request information may be provided to the clock enabling circuit if the digital signal received at the clock request input is low (negative logic).

It should be noted that the methods and systems including its preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner. Further, if not explicitly indicated otherwise, embodiments of the invention can be freely combined with each other.

BRIEF DESCRIPTION OF THE DRAWINGS

The invention is explained below in an exemplary manner with reference to the accompanying drawings, wherein.

DESCRIPTION

Figure 1:
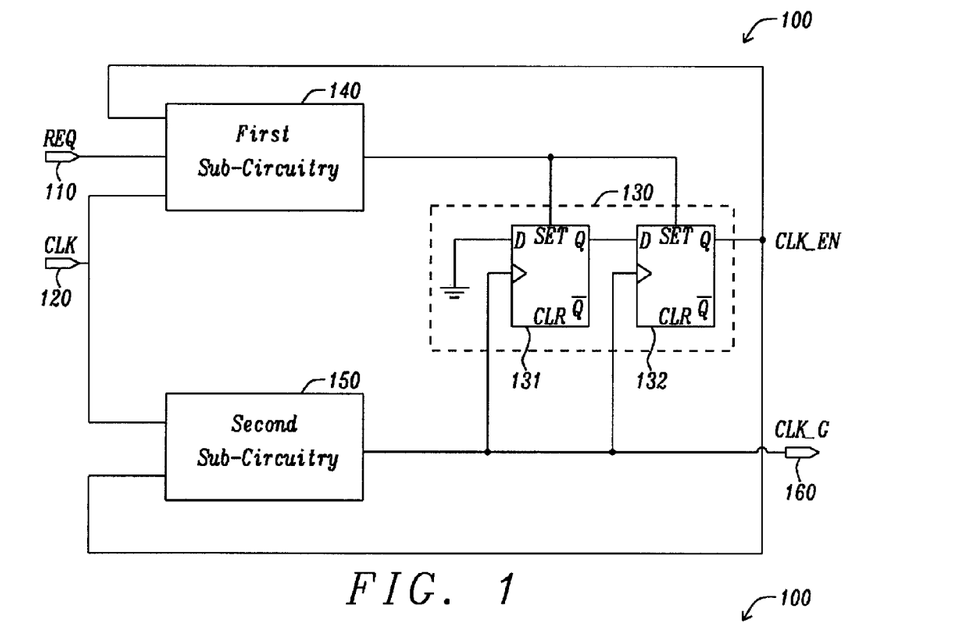
FIG. 1 illustrates an example schematic block diagram of the clock enabling circuit.

FIG. 1 shows a schematic structure of a clock enabling circuit 100 according to an embodiment based on a schematic block diagram. The clock enabling circuit 100 comprises a clock request input 110 for receiving clock request information REQ and a clock input 120 for receiving a clock signal. The clock request information REQ indicates that a gated clock signal CLK_G should be provided at the output 160 the clock enabling circuit 100. The gated clock signal CLK_G is a temporary clock signal which is synchronized with the clock signal CLK and which toggles between the two logical states "0" and "1" for a certain period of time triggered by the clock request information REQ. If no clock request information REQ is received, the gated clock signal CLK_G may take a fixed digital value, for example digital low ("0") or digital high ("1"). Said gated clock signal CLK_G may be used to provide a switched, temporary clock signal to a circuit block which is not working all the time but only in a predetermined period of time. Thereby, the power consumption of the circuit block is optimized.

The clock enabling circuit 100 comprises a flip-flop stage 130, a first sub-circuitry 140 and a second sub-circuitry 150. The first sub-circuitry 140 comprises at least a first input being coupled with the clock request input 110 and a second input being coupled with the clock input 120. The first sub-circuitry 140 further comprises an output being coupled with at least one input of the flip-flop stage 130. The first sub-circuitry 140 is configured to provide set information SET to the flip-flop stage 130 based on the clock request information REQ and the clock signal CLK.

According to the present embodiment, the flip-flop stage 130 comprises at least a first and a second flip-flop 131, 132, for example D-flip-flops. The first and second flip-flop 131, 132 may build a flip-flop chain, wherein the output of the first flip-flop 131, e.g. the non-inverting output (Q) is coupled with the input of the second flip-flop 132. The output of the second flip-flop 132 may form the output of the flip-flop stage 130 and may provide a clock enabling information CLK_EN based on the set information SET provided by the first sub-circuitry 140. For example, the output of the first sub-circuitry 140 may be coupled with the set inputs of the first and second flip-flop 131, 132. The data input of the first flip-flop 131 may be connected with ground. The output of the flip-flop stage 130 may be coupled with a third input of the first sub-circuitry 140 in order to provide the clock enabling information CLK_EN to the first sub-circuitry 140. In addition, the output of the flip-flop stage 130 may be coupled with an input of the second sub-circuitry 150.

The second sub-circuitry 150 comprises a first and a second input, wherein the first input is coupled with the clock input 120 for receiving the clock signal CLK and the second input is coupled with the output of the flip-flop stage 130 for receiving the clock enabling information CLK_EN. The output of the second sub-circuitry 150 constitutes the output 160 of the clock enabling circuit 100, i.e. provides the gated clock signal CLK_G. Said output of the second sub-circuitry 150 is further coupled with the clock inputs of the first and second flip-flops 131, 132 of the flip-flop stage 130. In other words, the first and second flip-flops 131, 132 providing the clock enabling information CLK_EN are triggered by the gated clock signal CLK_G. Thereby, the flip-flop stage 130 is only triggered temporarily if the gated clock signal CLK_G is toggling and deactivated if the gated clock signal CLK_G takes a fixed value (e.g. digital low, "0"). Thereby the power consumption of the clock enabling circuit 100 is minimized.

Figure 2:
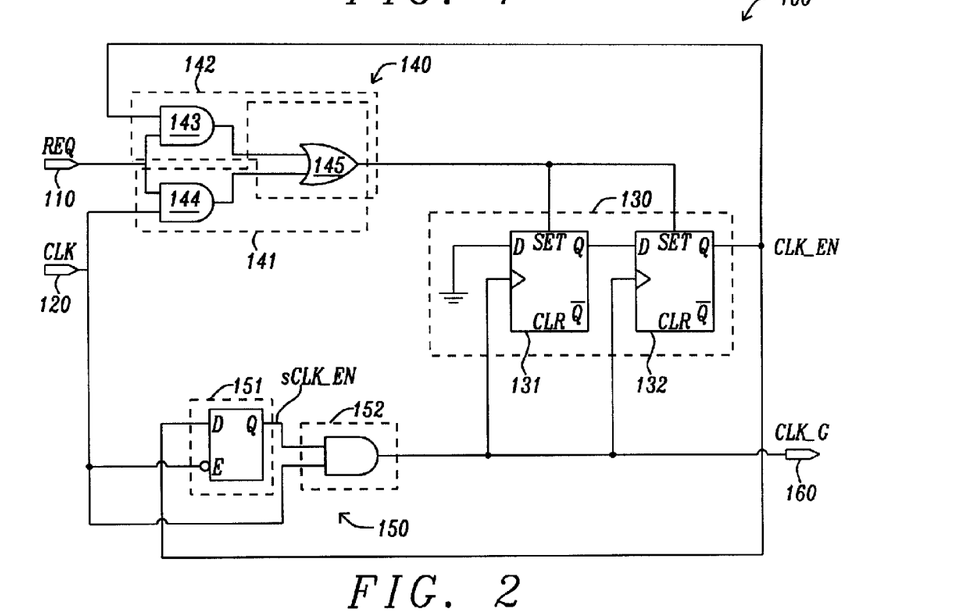
FIG. 2 illustrates an example implementation of the clock enabling circuit according FIG. 1.

FIG. 2 shows the clock enabling circuit 100, specifically the first and second sub-circuitries 140, 150 in closer detail. The first sub-circuitry 140 comprises a first sub-circuitry portion 141 and a second sub-circuitry portion 142. The first sub-circuitry portion 141 comprises a first and a second input, wherein the first input is coupled with the clock request input 110 and the second input being coupled with the clock input 120. In other words, the first and second input of the first sub-circuitry portion 141 forms the first and second input of the first sub-circuitry 140. The first sub-circuitry portion 141 is configured to provide the set information at the output of the first sub-circuitry 140 based on the clock request information REQ and the clock signal CLK. More specifically, the first sub-circuitry portion 141 is adapted to provide the set signal SET at the output of the first sub-circuitry portion 141 if the clock request information REQ is received and the digital level of the clock signal CLK is high (digital "1"). For example, the first sub-circuitry portion 141 may comprise an AND-gate 144 receiving the clock request information REQ and the clock signal CLK at its inputs.

The second sub-circuitry portion 142 of the first sub-circuitry 140 is adapted to uphold or maintain the set information SET as long as the clock request information REQ is provided in order to uphold or maintain the clock enabling information CLK_EN provided by the flip-flop stage 130. The second sub-circuitry portion 142 may comprise a first and the second input wherein the first input is connected to the clock request input 110 for receiving the clock request information REQ and the second input is connected with the output of the flip-flop stage 130 for receiving the clock enabling information CLK_EN. The output of the second sub-circuitry portion 142 forms the output of the first sub-circuitry 140 providing the set information SET. For example, the second sub-circuitry portion 142 may comprise an AND-gate 143 combining the clock request information REQ and the clock enabling information CLK_EN.

In order to provide the set information SET at a common output of the first sub-circuitry 140, the first and second sub-circuitry portion 141, 142 comprise a common OR-Gate, wherein the inputs of the OR-gate 145 are coupled with outputs of the AND-gates 143, 144. The output of the OR-gate 145 forms the output of the first and second sub-circuitry portion 141, 142, respectively, the output of the first sub-circuitry 140 providing the set information SET.

The second sub-circuitry 150 comprises a triggering circuitry 151 and a gate circuitry 152. The triggering circuitry 151 comprises a first input being coupled with the output of the flip-flop stage 130 for receiving the clock enabling information CLK_EN and a second input coupled with the clock input 120 for receiving the clock signal CLK. Furthermore, the triggering circuitry 151 may comprise an output for providing a synchronized clock enabling information sCLK_EN. The triggering circuitry 151 may be configured to synchronize an edge, for example the rising edge of the synchronized clock enabling information sCLK_EN with an edge of the clock signal CLK, e.g. the falling edge of the clock signal CLK. In order to provide upper-mentioned triggering properties, the triggering circuitry 151 may comprise a latch, specifically a level-sensitive latch. Said latch may comprise a data input coupled with the output of the flip-flop stage 130 for receiving the clock enabling information CLK_EN and an enabling input coupled with the clock input 120. Specifically, said enabling input may receive the inverted clock signal, i.e. the latch may store information provided at the data input when the clock signal CLK is low. In other words, the information provided at the data input D of the latch when the clock signal CLK is low (the latch is connected to the inverted clock signal) is output at the data output Q of the latch (i.e. the latch is "transparent" during the "low-phase" of the clock). Thereby, a synchronization of the synchronized clock enabling information sCLK_EN according to the falling edge of the clock signal CLK is achieved.

The gate circuitry 152 may receive the synchronized clock enabling information sCLK_EN at a first input and the clock signal CLK at a second input. The gate circuitry 152 may further comprise an output providing the gated clock signal CLK_G. The output of the gate circuitry 152 may form the output of the second sub-circuitry 150. The gate circuitry 152 may be adapted to provide the clock signal CLK at its output when the digital level of the synchronized clock enabling information sCLK_EN is high. For example, the gate circuitry 152 may be an AND-gate. Thereby, the gated clock signal CLK_G is synchronized with the clock signal CLK.

In the following, the operation of the clock enabling circuit 100 is explained based on FIGS. 2 and 3. The first sub-circuitry 140, specifically the first sub-circuitry portion 141 receives the clock signal, typically a square-wave-signal. If a clock request information REQ is received (e.g.

REQ=1), the first sub-circuitry 140 provides a set information SET at its output (e.g. SET=1). More specifically, if the clock signal CLK and the clock request information REQ are digital high (CLK=REQ=1), the AND-gate 144 provides a digital one at its output. Thus, the OR-gate 145 also provides a digital one at its output, i.e. SET=1. It is worth mentioning, that the set information SET can only be provided if the clock signal CLK is high.

The set information SET is provided to the flip-flop-stage 130 and the flip-flops 131, 132 of said flip-flop-stage 130 are set (Q=1). Said flip-flop state is maintained as long as SET=1. As a consequence, clock enabling information CLK_EN is provided at the output of the flip-flop-stage 130. Specifically, clock enabling information CLK_EN is provided asynchronously with respect to the clock signal CLK. As shown in FIG. 3, there may be a time offset between the rising edges of the clock request signal REQ, the set information SET and the clock enabling information CLK_EN which is caused by gate delays.

The clock enabling information CLK_EN is fed back to the third input of the first sub-circuitry 140 in order to keep the set information SET at digital high level as long as the clock request information REQ is received. The second sub-circuitry portion 142 receiving the clock request information REQ and the clock enabling information CLK_EN provides a hold circuitry, keeping the set information SET at digital high level if the clock request information REQ and the clock enabling information CLK_EN are logical high. Said hold circuitry may be realized by means of the AND-gate 143. In other words, the first sub-circuitry portion 141 causes the set-operation of the set information SET and the second sub-circuitry portion 142 maintains the set information SET as long as the clock request information REQ is received (REQ=1).

The clock enabling information CLK_EN is provided to an input of the triggering circuitry 151, e.g. the data input of the latch. Furthermore, the triggering circuitry 151 receives the clock signal CLK. Specifically, the clock signal CLK is provided to the enabling input of the latch in order to provide a synchronized clock enabling information sCLK_EN based on the clock signal CLK and the clock enabling information CLK_EN. According to the present embodiment, the latch receives the inverted clock signal CLK. For example, there may be an inverter between the clock input 120 and the enabling input of the latch. Thereby, the latch takes the digital value provided at the data input D when the clock signal CLK is low and provides said value at its output (e.g. Q-output). Thereby, the synchronized clock enabling information sCLK_EN is synchronized with the falling edge of the clock signal CLK.

The synchronized clock enabling information sCLK_EN is provided to the gate circuitry 152. By means of the synchronized clock enabling information sCLK_EN, the clock signal CLK is temporarily provided as the gated clock signal CLK_G at the output of the gate circuitry 152, respectively, the output 160 of the clock enabling circuit 100. The gated clock signal CLK_G is provided at the output of the gate circuitry 152, respectively the output of the clock enabling circuit 100 as long as the synchronized clock enabling information sCLK_EN is received at the gate circuitry 152. If no synchronized clock enabling information sCLK_EN is received at the gate circuitry 152, the gated clock signal CLK_G is disabled (CLK_G=0).

Figure 3:
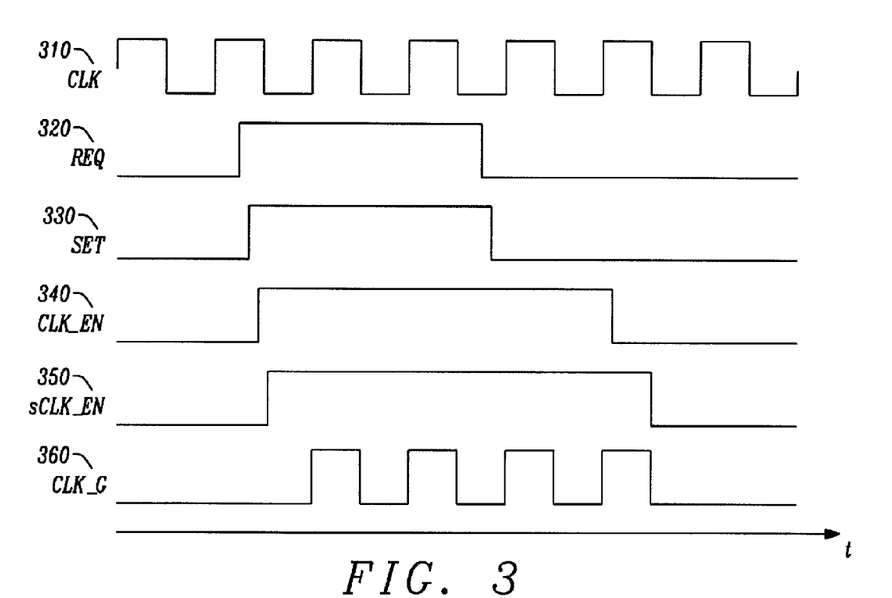
FIG. 3 illustrates an example signal diagram of the clock enabling circuit of FIG. 2.

As further shown in FIG. 3, after the falling edge of the set information SET, the clock enabling information CLK_EN remains at logical high for a certain period of time. After the set information SET is switched to logical low (SET=0), the flip-flops 131, 132 are able to take the data value provided at its data input triggered by the gated clock signal CLK_G. The first flip-flop 131 is coupled with ground level at its data input and may therefore set its data output to logical low at the rising edge of the gated clock signal CLK_G. The clock enabling information CLK_EN is set to logical low when the second rising edge is received after the falling edge of the set information SET. In other words the clock enabling information CLK_EN is switched off synchronously with respect to the clock signal CLK. After the clock enabling information CLK_EN has been set to digital low, the synchronized clock enabling information sCLK_EN is also set to digital low at the following falling edge of the clock signal CLK. Thus, the gated clock signal CLK_G is switched off at the falling edge of the clock signal CLK after the clock enabling information CLK_EN has been set to digital low.

In order to avoid any peaks or spikes at the gated clock signal CLK_G, an optimized time scheduling between the occurrence of the clock request information REQ, the clock enabling information CLK_EN and the gated clock signal CLK_G is realized. As already mentioned above, the set information SET can only be switched from digital low to digital high if the clock signal CLK is digital high. Neglecting the gate delays, the rising edge of the clock enabling information CLK_EN may also coincide with a digital high phase of the clock signal CLK. In order to avoid any spikes at the gated clock signal CLK_G when switching the gated clock signal CLK_G on, the triggering circuitry 151 is adapted to take the digital value provided at the data input of the triggering circuitry 151 during a digital low phase of the clock signal CLK (because of receiving the inverted clock signal CLK). Thus, the latch of the triggering circuitry 151 has enough time to store the value provided at the data input and provide it at its output well before the following rising edge of the clock signal CLK. In other words, the second sub-circuitry 150 is asynchronously enabled by asserting the SET input of the synchronization flip-flops 131, 132 during the high phase of the clock signal CLK, instead of synchronizing the asynchronous clock request information REQ to the ungated clock domain.

Figure 4:
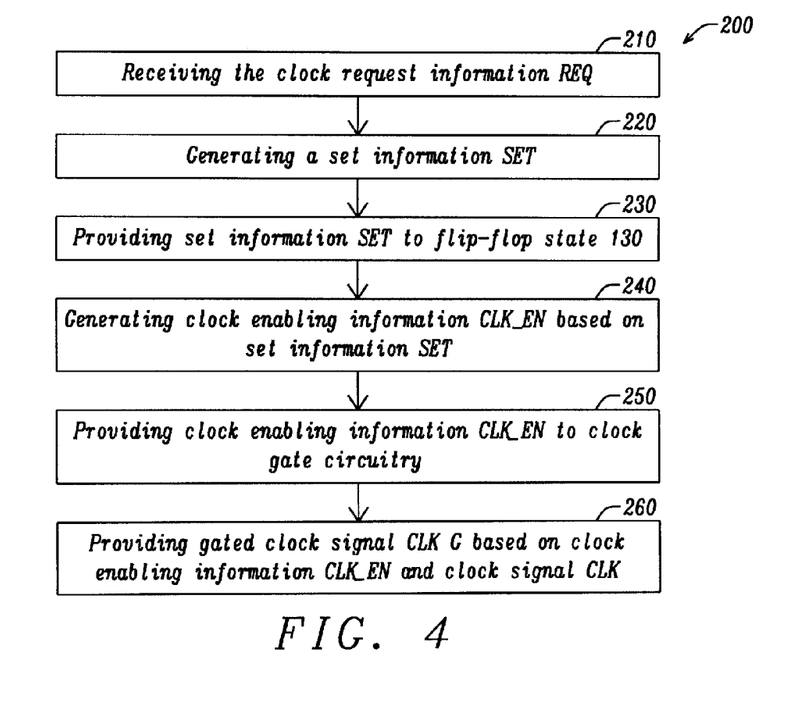
FIG. 4 shows a schematic flow chart illustrating the steps of a method for providing a gated clock signal.

FIG. 4 shows a schematic flow chart of a method 200 for providing a gated clock signal CLK_G in response to receiving clock request information REQ. After receiving the clock request information REQ (step 210), set information SET is generated based on the clock request information REQ and the clock signal CLK (step 220). Said set information SET is provided to the flip-flop stage 130 (step 230) in order to generate a clock enabling information CLK_EN based on the set information SET (step 240). For example, the set information SET may be provided to the set inputs of a first and a second flip-flop 131, 132 of the flip-flop stage 130. After generating the clock enabling information CLK_EN, said clock enabling information CLK_EN is provided to a clock gate circuitry 150 (step 250) in order to provide a gated clock signal CLK_G based on the clock enabling information CLK_EN and the clock signal CLK (step 260). Thereby, the flip-flops 131, 132 of the flip-flop stage 130 are triggered based on the gated clock signal CLK_G.

Figure 5:
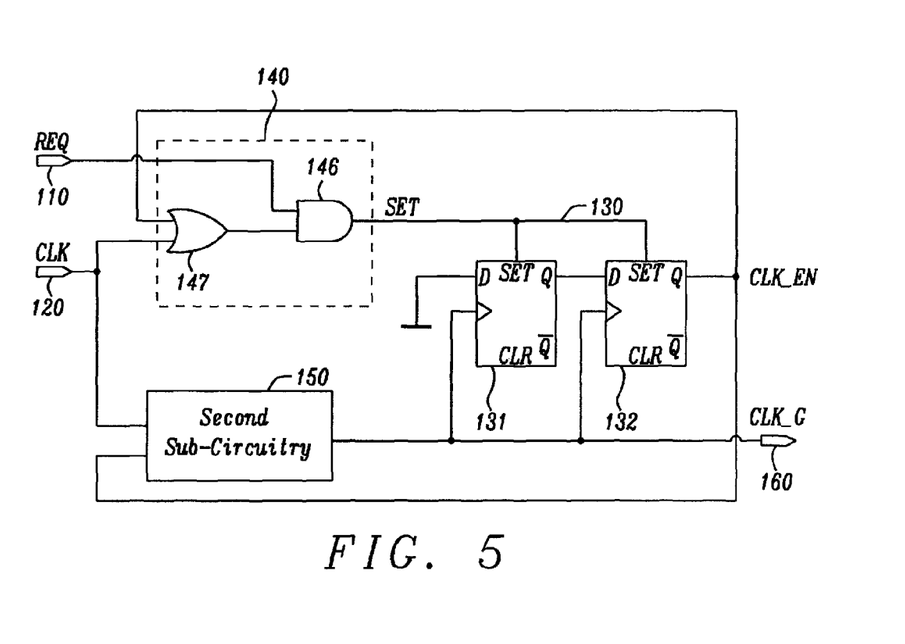
FIG. 5 illustrates a further example implementation of the clock enabling circuit according FIG. 1.

FIG. 5 illustrates a further example implementation of the clock enabling circuit 100 using one OR-gate 147 combined with one AND-gate 146, and providing equal functionality as the circuit shown in FIG. 2. The clock signal CLK 120 is provided to an OR gate 147 and to the second sub-circuitry 150. The clock request signal REQ 110 is input to an AND gate 146 which also receives the output of the OR gate 147 to produce the SET signal 130 that is applied to the flip flops 131, 132. The clock enabling signal CLK_EN provided by the second flip flop 132 is fed back and input to the OR gate 147. In summary, the OR gate 147 and the AND gate 146 operate as first sub-circuitry 140 and provide the same function as the combination of gates 143, 144, 145 shown in FIG. 2, namely generating the SET signal 130 based on the clock request signal REQ 110, the clock signal CLK 120, and the clock enabling signal CLK_EN.

Summing up, a clock enabling circuit 100 has been proposed. The main advantage of the clock enabling circuit 100 is that the synchronization flip-flops 131, 132 are part of the gated clock tree branch and do not contribute to the clock and clock tree power consumption in case the gated clock signal is turned off. Furthermore, the time delay between asynchronous request assertion and availability of the first clock pulse is minimized compared to state of the art implementations. Finally, a glitch-free gated clock signal is provided due to an appropriate time scheduling.

In the present document, the term "couple" or "coupled" refers to elements being in electrical communication with each other, whether directly connected e.g., via wires, or in some other manner.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A clock enabling circuit for providing a gated clock signal (CLK_G) in response to receiving clock request information (REQ), the clock enabling circuit comprising:
   a clock request input for receiving the clock request information (REQ);
   a clock input for receiving a clock signal (CLK);
   a flip-flop stage comprising at least a first and a second flip-flop, wherein an output of the first flip-flop is coupled with the input of the second flip-flop;
   a first sub-circuitry comprising at least a first input being coupled with the clock request input and an output being coupled with the flip-flop stage for providing a set information (SET) to the flip-flop stage in response to receipt of the clock request information (REQ), the flip-flop stage being configured to provide a clock enabling information (CLK_EN) in response to receiving the set information (SET);
   a second sub-circuitry comprising a first and a second input, the first input being coupled with the clock input for receiving the clock signal (CLK) and the second input being coupled with the output of the flip-flop stage for receiving the clock enabling information (CLK_EN), the second sub-circuitry comprising a triggering circuitry for providing, based on the clock enabling information (CLK_EN), a synchronized clock enabling information (sCLK_EN) that is synchronized with an edge of the clock signal (CLK), an output of the second sub-circuitry providing the gated clock signal in response to the synchronized clock enabling information (sCLK_EN) and the clock signal (CLK).

2. The clock enabling circuit according to claim 1, wherein the clock inputs of the first and second flip-flop are coupled with the output of the second sub-circuitry in order to be triggered by the gated clock signal (CLK_G).

3. The clock enabling circuit according to claim 1, wherein the first sub-circuitry is further coupled with the clock input and comprises a first sub-circuitry portion configured to provide the set information to the flip-flop stage based on the clock request information (REQ) and in synch with the clock signal (CLK).

4. The clock enabling circuit according to claim 1, wherein the first sub-circuitry comprises a second sub-circuitry portion configured to uphold the set information based on the clock request information (REQ).

5. The clock enabling circuit according to claim 1, wherein the first sub-circuitry comprises a first and a second AND-gate and an OR-gate, wherein the outputs of the AND-gates are coupled with the input of the OR-Gate and the output of the OR-gate constitutes the output of the first sub-circuitry.

6. The clock enabling circuit according to claim 5, wherein a first input of the first AND-gate is coupled with the clock request input (REQ) and the second input of the first AND-gate is coupled with the output of the flip-flop stage in order to receive clock enabling information (CLK_EN), and wherein a first input of the second AND-gate is coupled with the clock request input (REQ) and the second input of the second AND-gate is coupled with the clock input (CLK).

7. The clock enabling circuit according to claim 1, wherein the first sub-circuitry comprises an OR-gate and an AND-gate, the inputs of the OR-gate coupled with the clock input (CLK) and the clock enabling information (CLK_EN), respectively, the inputs of the AND-gate coupled with the clock request input (REQ) and the output of the OR-gate, respectively, and the output of the AND-gate being the output of the first sub-circuitry.

8. The clock enabling circuit according to claim 1, wherein the second sub-circuitry comprises a gate circuitry, the gate circuitry being configured to receive the synchronized clock enabling information and being configured to provide the gated clock signal (CLK_G) based on the synchronized clock enabling information and the clock signal.

9. The clock enabling circuit according to claim 1, wherein the triggering circuitry comprises a latch with an enabling input, the enabling input receiving an inverted clock signal.

10. The clock enabling circuit according to claim 9, wherein the latch of the triggering circuitry comprises a data input, the data input being coupled with the output of the flip-flop stage for receiving the clock enabling information (CLK_EN).

11. The clock enabling circuit according to claim 8, wherein the gate circuitry comprises an AND-gate, the AND-gate comprising a first input for receiving the synchronized clock enabling information provided by the triggering circuitry, a second input coupled with the clock input for receiving the clock signal (CLK), and an output for providing the gated clock signal (CLK_G).

12. The clock enabling circuit according to claim 1, wherein the second sub-circuitry comprises a gate that is adapted to gate the clock signal (CLK) and to provide the gated clock signal (CLK_G), the second sub-circuitry opening the gate only when the clock signal is low.

13. The clock enabling circuit according to claim 1, wherein the data input of the first flip-flop is connected with ground.

14. A method for providing a gated clock signal in response to receiving clock request information (REQ), the method comprising the steps of:
receiving the clock request information (REQ) and a clock signal (CLK);
generating set information (SET) in response to the received clock request information (REQ) and the received clock signal (CLK);
providing the set information to a flip-flop stage comprising at least a first and a second flip-flop;
generating a clock enabling information (CLK_EN) by said flip-flop stage in response to receiving the set information (SET);
generating a synchronized clock enabling information (sCLK_EN) based on the clock enabling information (CLK_EN), the synchronized clock enabling information being synchronous with an edge of the clock signal;
providing the synchronized clock enabling information (sCLK_EN) to a clock gate in order to provide the gated clock signal (CLK_G) based on the clock signal (CLK).

15. A method for providing a clock enabling circuit for providing a gated clock signal (CLK_G) in response to receiving clock request information (REQ), the clock enabling circuit comprising the steps of:
providing a clock request input for receiving the clock request information (REQ);
providing a clock input for receiving a clock signal (CLK);
providing a flip-flop stage comprising at least a first and a second flip-flop, wherein an output of the first flip-flop is coupled with the data input of a second flip-flop;
providing a first sub-circuitry comprising at least a first input being coupled with the clock request input and an output being coupled with the flip-flop stage for providing a set information (SET) to the flip-flop stage in response to receipt of the clock request information (REQ), the flip-flop stage for providing clock enabling information (CLK_EN) in response to receiving the set information (SET);
providing a second sub-circuitry comprising a first and a second input, the first input being coupled with the clock input and the second input being coupled with the output of the flip-flop stage, the second sub-circuitry comprising a triggering circuitry for providing, based on the clock enabling information (CLK_EN), a synchronized clock enabling information (sCLK_EN) that is synchronized with an edge of the clock signal (CLK), an output of the second sub-circuitry providing the gated clock signal in response to the synchronized clock enabling information (sCLK_EN) and the clock signal (CLK).

16. The method for providing a clock enabling circuit according to claim 15, wherein the clock inputs of the first and second flip-flop are coupled with the output of the second sub-circuitry in order to be triggered by the gated clock signal (CLK_G).

17. The method for providing a clock enabling circuit according to claim 15, wherein the first sub-circuitry is further coupled with the clock input and comprises a first sub-circuitry portion to provide the set information to the flip-flop stage based on the clock request information (REQ) and in synch with the clock signal (CLK).

18. The method for providing a clock enabling circuit according to claim 15, wherein the first sub-circuitry comprises a second sub-circuitry portion upholds the set information based on the clock request information (REQ).

19. The method for providing a clock enabling circuit according to claim 15, wherein the first sub-circuitry comprises a first and a second AND-gate and an OR-gate, wherein the outputs of the AND-gates are coupled with the input of the OR-Gate and the output of the OR-gate constitutes the output of the first sub-circuitry.

20. The method for providing a clock enabling circuit according to claim 19, wherein a first input of the first AND-gate is coupled with the clock request input (REQ) and the second input of the first AND-gate is coupled with the output of the flip-flop stage in order to receive clock enabling information (CLK_EN), and wherein a first input of the second AND-gate is coupled with the clock request input (REQ) and the second input of the second AND-gate is coupled with the clock input (CLK).

21. The method for providing a clock enabling circuit according to claim 15, wherein the first sub-circuitry comprises an OR-gate and an AND-gate, the inputs of the OR-gate coupled with the clock input (CLK) and the clock enabling information (CLK_EN), respectively, the inputs of the AND-gate coupled with the clock request input (REQ) and the output of the OR-gate, respectively, and the output of the AND-gate being the output of the first sub-circuitry.

22. The method for providing a clock enabling circuit according to claim 15, wherein the second sub-circuitry comprises a gate circuitry, the gate circuitry receives the synchronized clock enabling information and provides the gated clock signal (CLK_G) based on the synchronized clock enabling information and the clock signal.

23. The method for providing a clock enabling circuit according to claim 22, wherein the gate circuitry comprises an AND-gate, the AND-gate comprising a first input for receiving the synchronized clock enabling information provided by the triggering circuitry, a second input coupled with the clock input for receiving the clock signal (CLK), and an output for providing the gated clock signal (CLK_G).

24. The method for providing a clock enabling circuit according to claim 15, wherein the triggering circuitry comprises a latch with an enabling input, the enabling input receiving an inverted clock signal.

25. The method for providing a clock enabling circuit according to claim 24, wherein the latch of the triggering circuitry comprises a data input, the data input being coupled with the output of the flip-flop stage for receiving the clock enabling information (CLK_EN).

26. The method for providing a clock enabling circuit according to claim 15 wherein the second sub-circuitry comprises a gate that is adapted to gate the clock signal (CLK) and to provide the gated clock signal (CLK_G), the second sub-circuitry opening the gate only when the clock signal is low.

27. The method for providing a clock enabling circuit according to claim 15, wherein the data input of the first flip-flop is connected with ground.

* * * * *